United States Patent [19]
Kojima

[11] Patent Number: 5,739,568
[45] Date of Patent: Apr. 14, 1998

[54] NON-VOLATILE MEMORY HAVING A CELL APPLYING TO MULTI-BIT DATA BY DOUBLE LAYERED FLOATING GATE ARCHITECTURE AND PROGRAMMING METHOD FOR THE SAME

[75] Inventor: Toshiaki Kojima, Sendai, Japan

[73] Assignee: Motorola, Inc., Schaumburg, Ill.

[21] Appl. No.: 563,886

[22] Filed: Nov. 21, 1995

[30] Foreign Application Priority Data

Nov. 28, 1994 [JP] Japan ................................ 6-293343

[51] Int. Cl.$^6$ ........................................... H01L 29/788
[52] U.S. Cl. ................... 257/316; 257/319; 365/185.26
[58] Field of Search ............................. 257/316, 319, 257/320; 365/185.26

[56] References Cited

U.S. PATENT DOCUMENTS

| | | | |
|---|---|---|---|
| 4,417,264 | 11/1983 | Angle | 257/316 |
| 4,462,089 | 7/1984 | Miida et al. | 257/316 |
| 4,503,519 | 3/1985 | Arakana | 257/320 |
| 5,252,847 | 10/1993 | Arima et al. | 257/320 |
| 5,569,946 | 10/1996 | Hong | 365/185.26 |

FOREIGN PATENT DOCUMENTS

| | | | |
|---|---|---|---|
| 0219241 | 4/1987 | European Pat. Off. | 257/320 |
| 0036475 | 3/1977 | Japan | 257/320 |
| 0036476 | 3/1977 | Japan | 257/319 |
| 0040043 | 3/1979 | Japan | 257/319 |
| 0175770 | 10/1984 | Japan | 257/319 |
| 2-210879 | 8/1990 | Japan | 257/319 |
| 0006679 | 1/1991 | Japan | 257/319 |
| 0015444 | 6/1990 | WIPO | 257/319 |

OTHER PUBLICATIONS

A Functional MOS Transistor Featuring Gate-Level Weighted Sum and Threshold Operations, Shibata et al, IEE Transactions on Electron Devices, vol. 39, No. 6, Jun. 1992, pp. 1444–1455.

Complete Transient Simulation of Flash EEPROM Devices, Keeney et al, IEE Transactions on Electron Devices, vol. 39, No. 12, Dec. 1992, p. 2750–2757.

*Primary Examiner*—Tom Thomas
*Assistant Examiner*—David B. Hardy
*Attorney, Agent, or Firm*—Harry A. Wolin; Robert D. Atkins

[57] ABSTRACT

An object of the present invention is to contribute to increase of storage capacity of a memory. A non-volatile memory having a cell applying to multi-bit data by double layered floating gate architecture. The memory has a storage cell transistor which comprises source 2 and drain 3 being formed in a semiconductor substrate 1 distantly from each other. The storage cell transistor, furthermore comprises a single first floating gate 4A being laid between the source and drain above the semiconductor substrate, and a plurality of second floating gates $4B_1$–$4B_n$ which are distant from each other and face the first floating gate. Since the second floating gates respectively store carrier corresponding to data bits and the first floating gate determines a threshold value of drain current in accordance with sum amount of carrier stored in all of the second floating gates, two or more bits data can be saved per one storage cell.

11 Claims, 5 Drawing Sheets

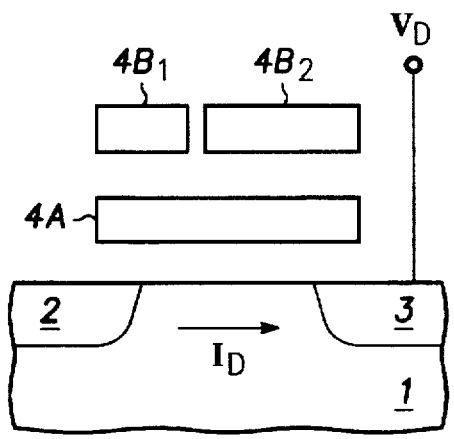
FIG. 4
FIG. 5
| SECOND FLOATING GATE | STATE OF DRAIN CURRENT | | | |
|---|---|---|---|---|
| | 1 | 2 | 3 | 4 |
| 4B₁ | 0 | 0 | 1 | 1 |
| 4B₂ | 1 | 0 | 1 | 0 |
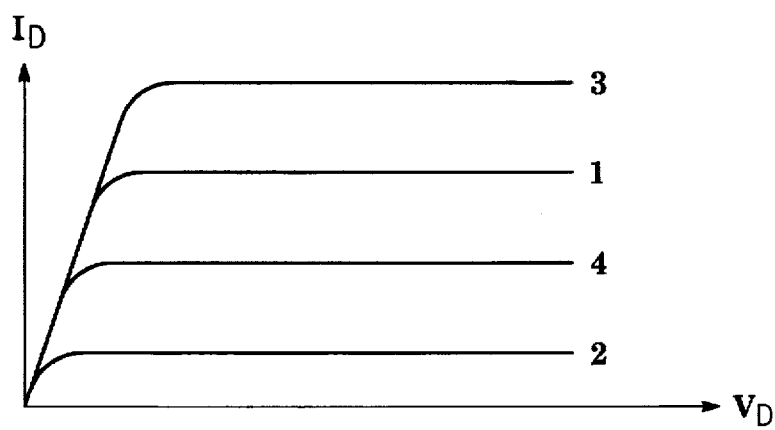
FIG. 6

NON-VOLATILE MEMORY HAVING A CELL APPLYING TO MULTI-BIT DATA BY DOUBLE LAYERED FLOATING GATE ARCHITECTURE AND PROGRAMMING METHOD FOR THE SAME

TECHNICAL FIELD

The present invention relates to non-volatile memories, and more specifically, to a memory in which a storage cell is comprised of a transistor having a floating gate architecture.

BACKGROUND

One of non-volatile memories in which a storage cell is comprised of a transistor having a floating gate and a control gate is described, for example, in "Complete Transient Simulation of Flash E$^2$PROM Devices" by S. Keeny et al., IEEE ED-39, No. 12 December 1992". The basic structure of this storage cell is illustrated in FIG. 1.

In FIG. 1, the storage cell is comprised of a MOS field-effect transistor (typically, a so-called SAMOS transistor) having source 2 and drain 3 formed on a substrate 1 made of an impurity semiconductor, such as p-type silicon; a floating gate 4 disposed along and above a channel between the source and drain, and also surrounded by an insulating material, such as an oxide; a control gate 5 formed above the gate 4 and separated by the oxide therefrom. FIG. 1(a) depicts how a write or programing is performed to the cell, where when the gate voltage $V_G$ and drain voltage $V_D$ are raised to high levels, hot electrons are generated, which are stored onto the floating gate 4. FIG. 1(b) depicts how information stored on the cell is erased, where raising the source voltage $V_S$ to a high level causes the electrons stored on the floating gate 4 to be pulled into the source 2, so that holes are stored on the floating gate 4. In other words, by controlling the carriers in the floating gate 4, an information storage state is produced in one cell. For example, the programming state is assigned to "0", and the erasure state to "1".

FIG. 2 shows drain current $I_D$ vs. gate voltage $V_G$ characteristics in programming and erasure states of the memory cell.

However, one cell assumes only two states; thus, because it stores only binary information (i.e., one bit of binary data), it has a disadvantage for recent trends toward expanding memory capacity.

It is an object of the present invention to provide a non-volatile memory which is amenable to increasing memory capacity, and a method of programming it.

SUMMARY OF THE INVENTION

A non-volatile memory according to the present invention is characterized by a storage cell transistor comprising: source and drain being formed in a semiconductor substrate distantly from each other; a single first floating gate being laid between said source and drain above said semiconductor substrate; and a plurality of second floating gates which are distant from each other and face said first floating gate.

A non-volatile memory according to the present invention is also characterized by a storage cell transistor comprising: source and drain being formed in a semiconductor substrate distantly from each other; a single first floating gate being laid between said source and drain above said semiconductor substrate; a plurality of second floating gates being disposed between said source and drain, opposite to and intersecting said floating gate, said plurality of second floating gates also being disposed distantly from each other; and for each of said floating gates, a control gate disposed from one end of said drain of said second floating gate up to said drain.

A method of programming according to the present invention comprises the steps of: applying a high voltage to said drain and control gates; and injecting hot electrons induced thereby near one end of said drain of said second floating gate into said second floating gate by a field between said control gate and semiconductor substrate.

With a non-volatile memory having a cell applying to multi-bit data by double-layered floating gate architecture, and method of programming the same, the second floating gates store carriers corresponding to each data bit, while the first floating gate determines a threshold value for drain current depending on the total amount of carriers stored on all the second floating gates.

BRIEF DESCRIPTION OF THE DRAWINGS

FIG. 4 is a cross-sectional view depicting the structure of the storage cell where two floating gates are formed based on the structure of FIG. 3.

FIG. 5 shows in tabular form the storage states of the storage cell of FIG. 4.

FIG. 6 shows drain current, $I_D$ vs. drain voltage $V_D$ characteristics in each storage state in the table of FIG. 5.

DETAILED DESCRIPTION OF THE PREFERRED EMBODIMENT

The present invention will be described in greater detail below, with reference to the drawings.

Figure 1A:
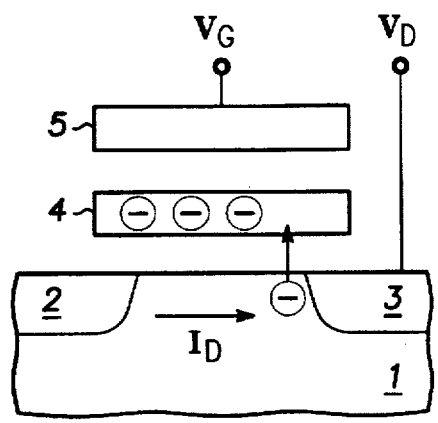
FIG. 1 is a cross-sectional view depicting a basic structure of a storage cell comprising a transistor having a floating gate and a control gate.
Figure 1B:
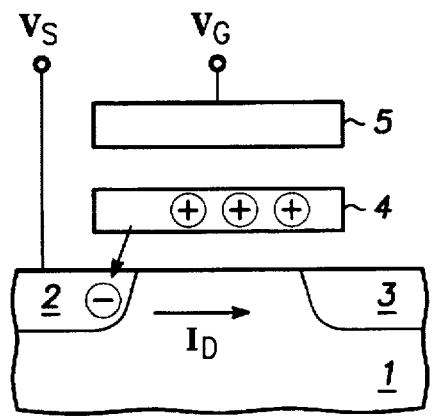
Figure 2:
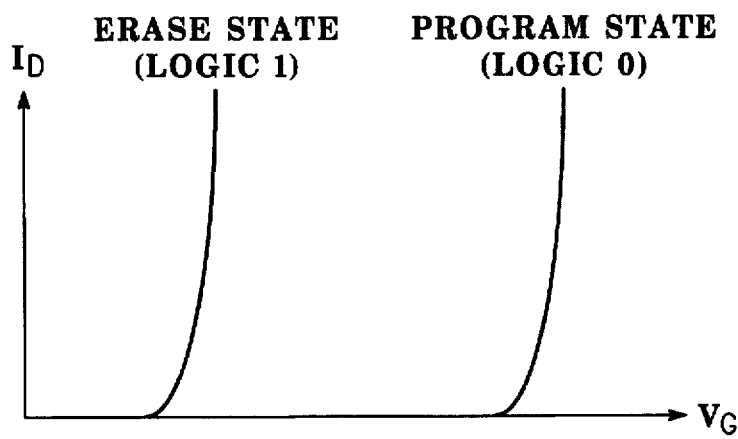
FIG. 2 shows drain current, $I_D$ vs. gate voltage, $V_G$, characteristics in the program and erasure states for the memory cell of FIG. 1.
Figure 3:
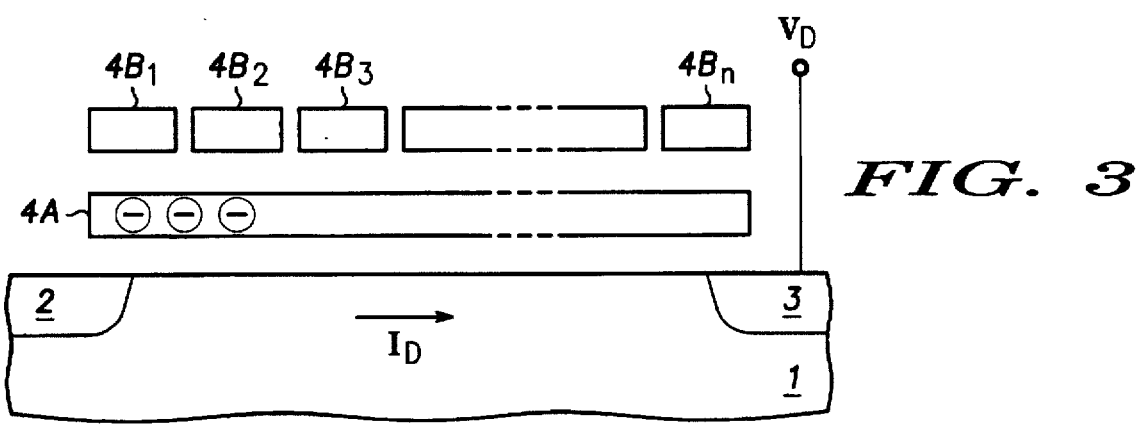
FIG. 3 is a cross-sectional view depicting a structure of a non-volatile memory according to one embodiment of the present invention.

FIG. 3 shows the structure of the storage cell of a non-volatile memory according to one embodiment of the present invention, where like reference numerals refer to the same or equivalent parts.

In FIG. 3, the transistor of such a memory cell has a source 2 and a drain 3 formed on a substrate 1 formed of an impurity semiconductor, such as p-type silicon; a first floating gate 4A being laid along and above a channel between the source and drain (or stacked distally thereon), and surrounded by an oxide; and at least two second floating gates $4B_x$ (x=1, 2, 3, ..., n) formed above the rectangular gate 4A (or stacked distally thereon) and disposed distantly from each other, and surrounded by the oxide. The first and second floating gate are formed of polysilicon, for example, and surrounded by $SiO_2$.

For the second floating gate, electrons (or holes) are charged, i.e., information is programmed, with a programming technique described later, and also electrons charged are emitted, i.e., information is erased, with a predetermined erasing technique, such as that based on ultraviolet irradiation. As may become apparent later, the carriers charged on each second floating gate controls the level of drain current $I_D$. Thus, by making each second floating gate correspond to bits of data to be stored and charging carriers to the second floating gate in response to those bits of data, the same number of bits of data as that of second floating gates can be stored.

FIG. 4 is used to present a more specific explanation. FIG. 4 shows the structure of the storage cell, where two second floating gates are provided based on the structure of FIG. 3, with like parts denoted by the same reference symbols.

In FIG. 4, a second floating gate $4B_1$ closer to the source 2 has a smaller effective area for changing carriers on the surface facing the first floating gate and the surface opposite thereto than a second floating gate $4B_2$ closer to the drain 3. With these two floating gates, the amount of carriers that can be charged thereon is set according to their effective area. As shown in FIG. 5, assuming that states where holes are charged by gates $4B_1$ and $4B_2$ and a neutral state is a logic "1", while a state where electrons are charged is a logic "0", then four combinations of states are possible for this cell.

Then, drain current $I_D$ vs. drain voltage $V_D$ characteristics are shown in FIG. 6. This indicates that four drain current values obtained relative to the drain voltage are different from one another; and because the effective area of the second floating gate $4B_2$ is greater than $4B_1$ by a predetermined value, the resulting drain current values drop in order from 3, 1, 4, and 2 indicative of the states of the drain current in the table of FIG. 5, so that four types of storage states are available in one cell. Likewise, if the effective areas of the n number of second floating gates in FIG. 3 are made different from one another, $2^n$ kinds of storage states can be obtained.

These aspects may be analyzed in greater detail as follows.

Figure 7:
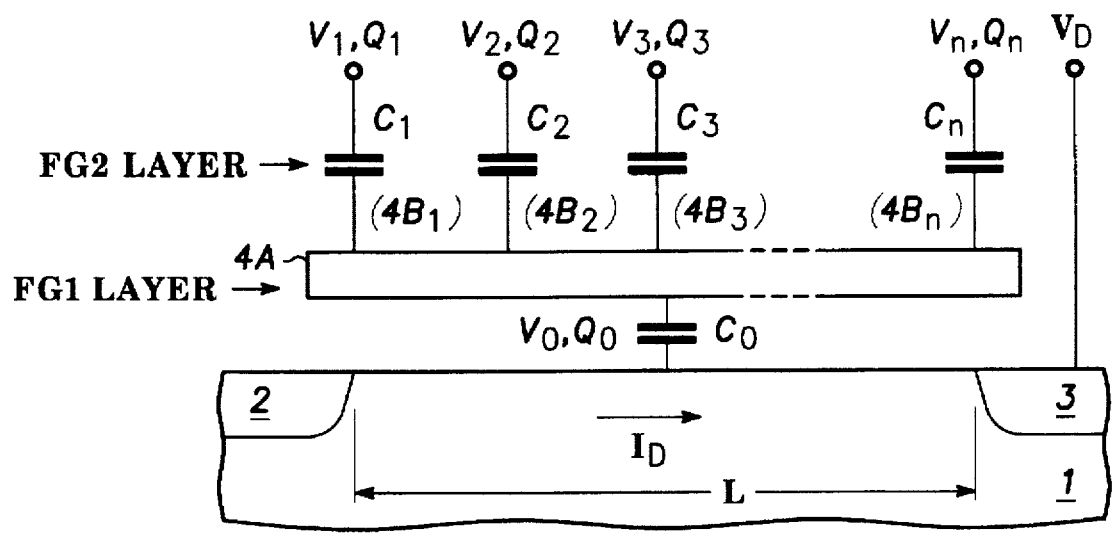
FIG. 7 is an equivalent circuit diagram of the storage cell of FIG. 3.

FIG. 7 shows an equivalent circuit of the storage cell of FIG. 3. This equivalent circuit is formed so that each oxide between the second floating gate (FG2) and first floating gate 4A is replaced by capacitance $C_x$ (x=1, 2, ..., n) having a voltage $V_x$ and a charge $Q_x$, and one end of the capacitance is commonly connected at the first floating gate 4A (FG1), and the source-to-drain channel of the substrate 1 and the first floating gate 4A are coupled together by a capacitance $C_0$ having a voltage $V_0$ and a charge $Q_0$.

In such an equivalent circuit, the total amount of charges $Q_{FG2}$ stored on all the second floating gates is expressed as:

$$Q_{FG2} = \sum_{i=1}^{n} Q_i = \sum_{i=1}^{n} C_i(V_i - V_o) \quad (1)$$

The total amount of charges $Q_0$ stored on the first floating gate 4A is expressed as:

$$Q_0 = C_0(V_0 - V_{sub}) \quad (2)$$

where $V_{sub}$=potential of semiconductor substrate 1.
According to conservation of charge:

$$Q_{FG2} = Q_0 \quad (3)$$

Thus, the voltage of the first floating gate 4A is determined by:

$$V_0 = \left( \sum_{i=0}^{n} C_i V_i + C_0 V_{SUB} \right) / \sum_{i=0}^{n} C_i \quad (4)$$

Under a threshold condition where the drain current is turned on (rises), the source-to-drain surface potential of the substrate 1 is changed to $2f_f$ (where $f_f$ is a difference between the energy $E_i$ at the center of the forbidden band and the Fermi level $E_F$) (thus, $V_{sub}=2f_f$), and the threshold voltage $Vth_{FG1}$ of the first floating gate may be expressed as:

$$Vth_{FG1} = \left( \sum_{i=0}^{n} C_i V_i + C_0 \cdot 2f_f \right) / \sum_{i=0}^{n} C_i \quad (5)$$

Then, $Q_0$ is equal to charge $Q_{dep}$ in the depletion mode, so the following equations are met:

$$C_o \cdot (Vth_{FG1} - 2f_f) = \sqrt{2e_s q N_{sub} \cdot 2f_f} \quad (6)$$

$$Vth_{FG1} = 2f_f + \sqrt{2e_s q N_{sub} \cdot 2f_f} / C_o \quad (7)$$

where:
$e_s$=dielectric constant of semiconductor substrate 1;
q=raw charge amount of electrons; $N_{sub}$=impurity density of semiconductor substrate 1.

Under the drain-current on state, $V_0 > Vth_{FG1}$, so the voltage of the first floating gate 4A is given by:

$$V_{FG1} > 2f_f + \sqrt{2e_s q N_{sub} \cdot 2f_f} / C_o \quad (8)$$

The drift channel current may be expressed as:

$$I_D = \mu Q_N E$$

where:
μ=electron mobility; and
E=lateral field of channel.
$Q_N$, which represents charge on the inverted layer, may be written as:

$$Q_N = C_0(V_0 - Vth_{FG1} - V) \quad (10)$$

where V is a channel voltage.

$$I_d = \mu W C_0 (V_0 - Vth_{FG1} - V) \cdot \frac{dV}{dy} \quad (11)$$

where:
W=channel width; and
dy=differential length in channel direction.
By integrating the channel current from the source to drain yields:

$$\int_0^L I_D dy = \int_0^{V_D} \mu W C_o (V_o - Vth_{FG1} - V) dV \quad (12)$$

where L is an effective channel length.

$$I_D = \frac{W}{L} \cdot \mu C_o \{ (V_o - Vth_{FG1}) V_D - 0.5 V_D^2 \} \quad (13)$$

Thus, as may be apparent from Eq. (5), the threshold voltage of the first floating gate for conducting a drain current is determined by the sum of charges stored on the second floating gates. In other words, the first floating gate serves to indirectly determine the operation of the cell transistor in accordance with the sum of charges stored on all the second floating gates. In addition, provision of the first floating gate 4A allows a single cell transistor to handle different threshold voltages. Furthermore, because summing of charges or summing of signals is performed in voltage mode through capacitive coupling (static coupling), there is no need for charges themselves to move, so the power required for their summing can be said to be equal to zero. In the example of FIG. 4, the effective areas of the second floating gates are made different from one another and the amount of carriers stored, or values of capacitances $C_1$ and $C_2$ are varied for each gate to thereby perform so-called weighting, so that four results of addition are obtained. Similarly, if the effective areas of the n number of second floating gates in FIG. 3 are made different from one another, $2^n$ types of storage states become available.

On the other hand, if the areas of the second floating gates $4B_1$ and $4B_2$ are the same and electrons are injected into each second floating gate at an equal bias, then equivalent drain current values are obtained in drain current states 1 and 4 of FIG. 5, so that only three states are available for one cell; however, in this case, too, there is a benefit that three or more states can be produced for one cell. It should be noted that for two of input data bits, only three storage states are obtained, so that this must be supplemented.

Figure 8:
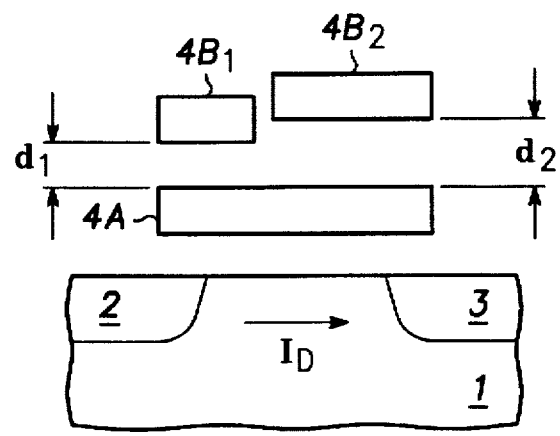
FIG. 8 is a cross-sectional view depicting an alternate embodiment of the structure of FIG. 4.

FIG. 8 shows an alternative embodiment of the structure in FIG. 4, where the effective areas of the second floating gates are made equal to one another and the distance from one of the second floating gates $4B_1$ to the first floating gate 4A is less than the distance from the other second floating gate 4B2 to the first floating gate 4A, i.e., $d_1 < d_2$. Even with this structure, because the second floating gates have different carrier storage capacities, four storage states as shown in FIGS. 5 and 6 may be produced. And likewise, if the distances of the n number of second floating gates to the first floating gate 4A are made different from one another, then the values of capacitances $C_1$ through $C_n$ in the equivalent circuit of FIG. 7 can be made different, thereby yielding $2^n$ types of storage states.

It should be appreciated that values of $C_1$ through $C_n$ depend not only on the electrode areas, i.e., the facing areas of the gates, and electrode spacing, i.e., the distance between the gates, but also on the properties of the intermediate material between the gates. Therefore, any of the parameters determining these capacitance values may be set as desired when fabricating the storage cell. Additionally, as shown in FIG. 6, in order for the drain current characteristics to be different from one another in each storage state, not only values of $C_1$ through $C_n$ but also values of $Q_1$ through $Q_n$ may be set so that $2^{2-1}$ types of $Vth_{FG1}$ values are obtained. Values of $Q_1$ through $Q_n$ are determined by each injection energy during injection of electrons into each second floating gate when programming is performed.

It has been explained so far that a plurality of second floating gates are provided which are stacked with a single first floating gate interleaved therebetween and having an appropriate size (i.e., a carrier storing capacity), and if each of them stores carriers corresponding to bits of data, then one cell can assume a plurality of data bits. Now, a specific carrier storing or programming method is described below.

Figure 9A:
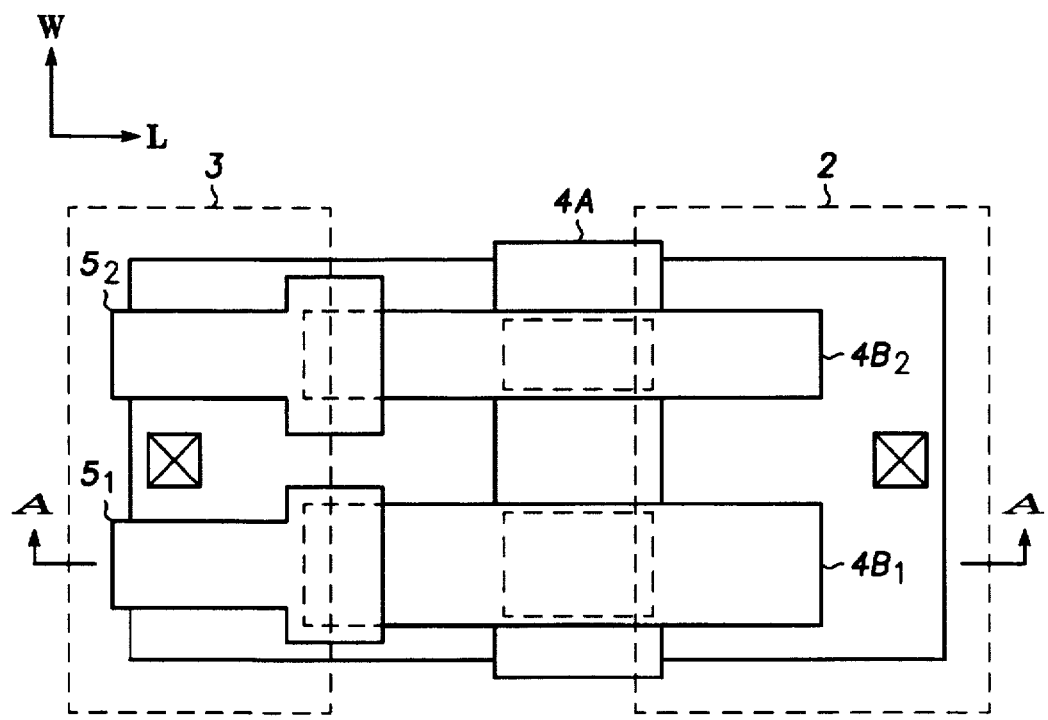
FIG. 9 includes a plan view (a) and a cross-sectional view (b) depicting the structure of the storage cell, based on the structure of FIG. 4, where hot-carrier injection is used to store carriers on each of the second floating gates.
Figure 9B:
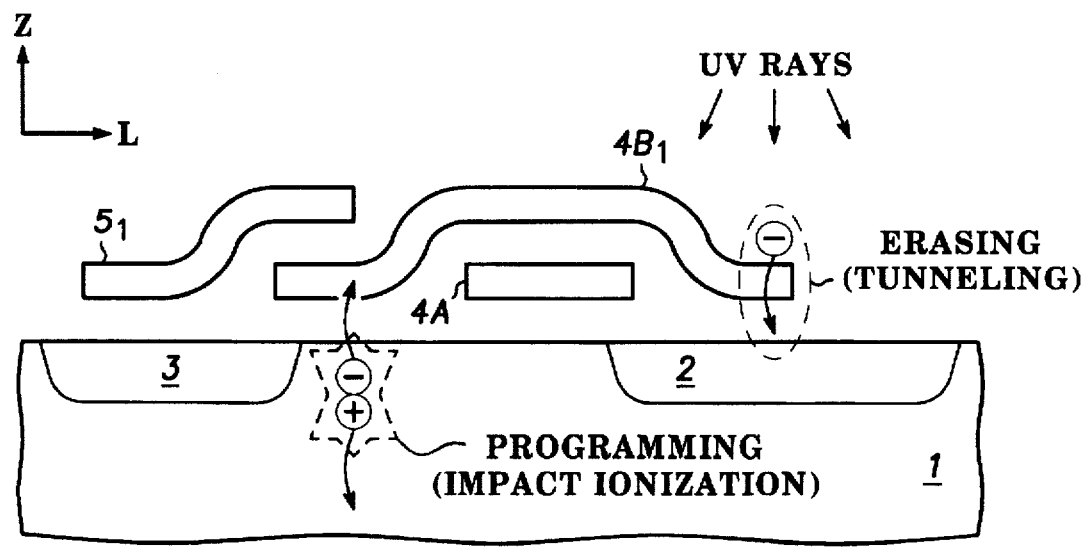

FIG. 9 shows the structure of a storage cell where programming is done for each of the two second floating gates by use of so-called hot-carrier injection. FIG. 9(a) is a plan view of the cell, while FIG. 9(b) is a cross-sectional view along A—A. In these figures, parts equivalent to those of FIG. 4 are denoted by the same reference symbol.

In FIG. 9, source 2 and drain 3 are formed distantly from each other in the direction L on a substrate 1. A first floating gate 4A formed of, for example, polysilicon, is formed in a rectangular shape, where it extends in the direction W, which is perpendicular to the direction L; the first floating gate is surrounded by an oxide, such as $SiO_2$, on the channel between the source and drain, and disposed slightly closer to the source 2. Above the first floating gate 4A (in the Z direction) are disposed second floating gates $4B_1$ and $4B_2$ formed of, for example, polysilicon, in a rectangular shape extending from the source 2 to the drain 3, each second floating gate surrounded by oxide and disposed perpendicular to the first floating gate 4A and distantly from each other. The second floating gates $4B_1$ and $4B_2$ are also formed in close proximity to the substrate 1 at a distance approximately equal to that for the first floating gate 4A, except for portions overlapped with the first floating gate 4A in the Z direction. Thus, the second floating gates $4B_1$ and $4B_2$ have a so-called cap shape, where they partially overlap the first floating gate 4A in the L direction. Furthermore, for the gates $4B_1$ and $4B_2$, their effective areas as described in FIG. 4 are set by the width in the W direction.

At the end of the drain 3 of the second floating gates $4B_1$ and $4B_2$, one end of polysilicon gates (hereinafter referred to as control gates) $5_1$ and $5_2$ are overlapped via oxide, and portions excluding that one end are formed in proximity to the substrate 1 at a distance nearly equal to the first floating gate 4A. The second floating gates $4B_1$ and $4B_2$, with the control gates $5_1$ and $5_2$, respectively, form an input bit, or a pair for individually programming the second floating gates, thereby providing a pair of one-bit blocks.

Figure 10:
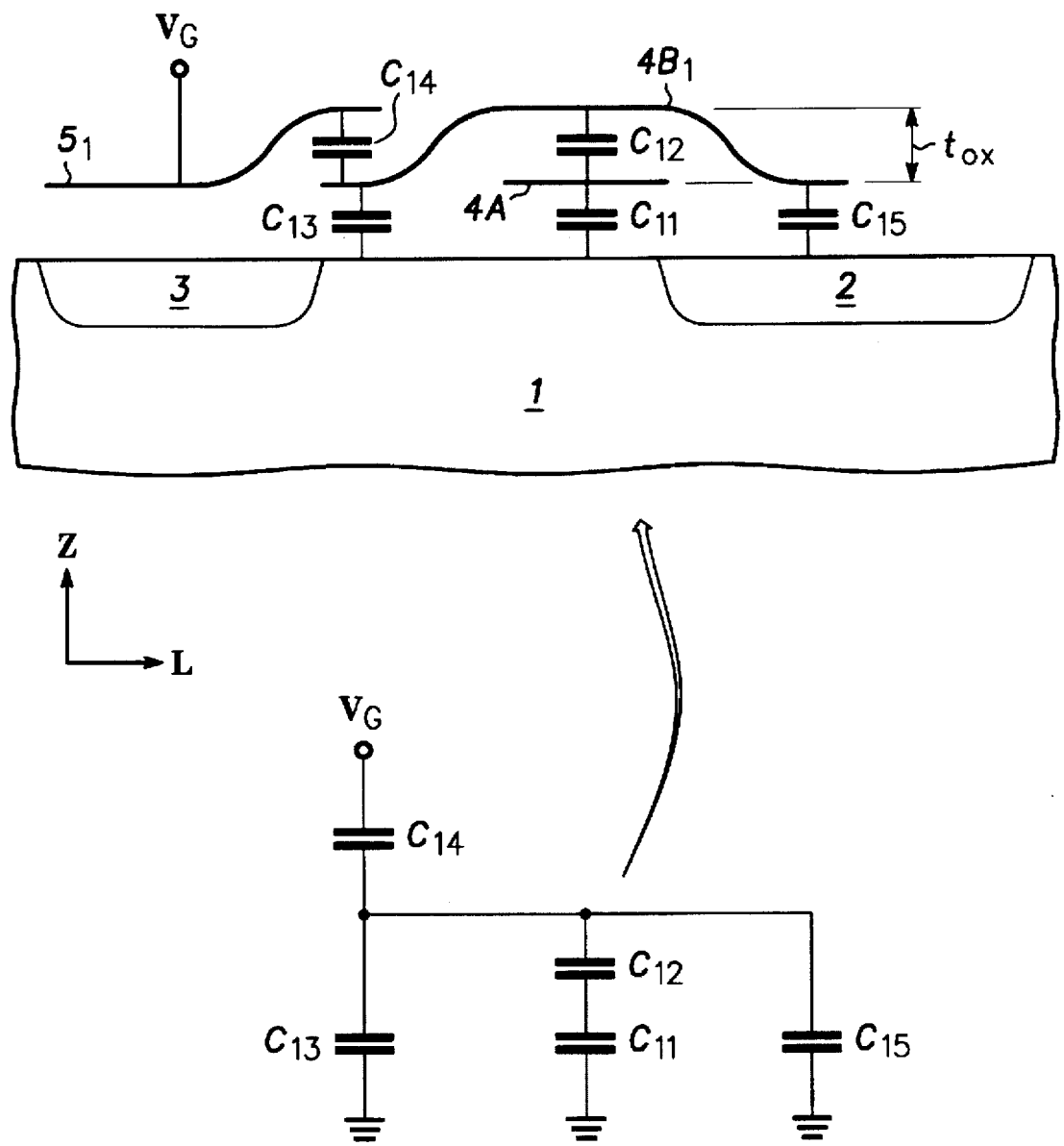
FIG. 10 is an equivalent circuit diagram of one-bit block of the storage cell transistor of FIG. 9.

FIG. 10 shows an equivalent circuit of the former one-bit block of the storage cell transistor. As shown in FIG. 10, the oxides between the substrate 1 and first floating gate 4A, between the first floating gate 4A and second floating gate $4B_1$, between the drain 3 on the substrate 1 and one end of the second floating gate $4B_1$, between one end of the second floating gate $4B_1$ and one end of the control gate $5_1$ stacked through that, and between the source 2 on the substrate 1 and one end of the second floating gate $4B_7$ may be substituted by capacitors $C_{11}$, $C_{12}$, $C_{13}$, $C_{14}$, and $C_{15}$, respectively. This may be redefined to yield a circuit diagram shown at bottom of FIG. 10.

The amount of charges stored on the second floating gate $4B_1$ is determined by the coupling of each capacitor. For example, the value of capacitor $C_{12}$ is approximately determined by the thickness of the oxide, $t_{ox}$, as shown in FIG. 10, and the electrode area that forms the capacitor, i.e., the overlapping area between the first floating gate 4A and second floating gate $4B_1$ (area defined by a broken-line box in FIG. 9(a)). Thus, if the thickness or area may be variably set for each of the second floating gates, then weighting as described in FIGS. 4 and 8 may be performed. In addition, by changing the capacitance except for $C_{12}$, weighting can be varied.

With the storage cell of such a structure, a channel is formed between the source 2 and drain 3 by applying a high voltage to the drain 3 and control gate $5_1$ or $5_2$ in the program mode, and the drain voltage applied causes impact ionization at the drain terminal, where hot electrons are generated. Then, the field between the control gate $5_1$ or $5_2$ and the substrate 1 pulls up the electrons generated, which are injected into the second floating gate $4B_1$ or $4B_2$. Because the first floating gate 4A is away from the edge of the drain 3, electrons are difficult to inject there. Because the control gate is formed corresponding to each second floating gate, the second floating gates can be programmed independently of each other. With the injection of carriers into the second floating gates through such hot carrier injection, they can be programmed quickly.

In the erasure mode, not only ultraviolet erasure, but also electrical erasure by Fowler-Nordheim field emission, can be implemented. To implement this electrical erasure, the second floating gates $4B_1$ and $4B_2$ are formed in an overlapping manner with the source 2 in the cap form as described above; and a thin oxide film (tunnel oxide) exists between the second floating gate and source. With this electrical erasure, the electrons stored or programmed in the second floating gate are pulled down to the source via that tunnel oxide by applying a sufficiently high positive voltage to the source.

Although the number of second floating gates is 2 in the above example, it should be appreciate that 3 or more second floating gates may be provided. In that case, the source and drain regions may be extended in the W direction in FIG. 9, and also the first floating gate may be extended in the W direction, thereby changing the size of each second floating gate in the W direction, along with which the control gate that forms a pair with that may be disposed. In this case, too, programming as described above may be performed for each second floating gate.

In each embodiment described above, the semiconductor substrate 1 was described as p-type silicon; however, it is not limited thereto, but may be n-type silicon, or other semiconductor material. Furthermore, the source, drain, floating gates and control gates, as well as other oxides may be comprised of various kinds of material in various shapes, so the present invention may be modified as appropriate within a scope that can be implemented by those skilled in the art.

As described above in detail, with a non-volatile memory having a cell applying to multi-bit data by double-layered floating gate architecture of the present invention and programming method for the same, because the second floating gate stores carriers corresponding to each data bit, and the first floating gate determines a drain current threshold depending on the total amount of carriers stored on all the second floating gates, only a single storage cell can save more than two bits of data. Thus, the real estate for each cell can be reduced, and thus the number of storage cells required for the entire memory may be minimized, thereby contributing to an increased storage capacity of a memory.

Furthermore, because programming based on hot-carrier injection can be applied to such a non-volatile memory, it can be implemented without reducing the programming speed.

Additionally, as compared to a cell transistor of such a structure that an amount of carriers corresponding to a plurality of input bits of data is stored on a single floating gate in an analog manner, the memory of the present invention has an advantage that because the second floating gates that store carriers are independent of each other corresponding to the input data bits, it could be easier to control carrier storage in the programming mode.

What is claimed is:

1. A non-volatile memory having a cell applying to multi-bit data by double layered floating gate architecture, which is characterized by a storage cell transistor comprising:

source and drain being formed in a semiconductor substrate distantly from each other;

a single first floating gate being laid between said source and drain above said semiconductor substrate;

a plurality of second floating gates which are distant from each other and face said first floating gate; and a plurality of control gates corresponding to each of the plurality of second floating gates, the plurality of control gates for programming at least one of the plurality of second floating gates.

2. A non-volatile memory according to claim 1, wherein said second floating gates have individually different effective areas for storing carriers.

3. A non-volatile memory according to claim 1, wherein said second floating gates have individually different distances from said first floating gate.

4. A non-volatile memory having a cell applying to multi-bit data by double layered floating gate architecture, which is characterized by a storage cell transistor comprising:

source and drain being formed in a semiconductor substrate distantly from each other;

a single first floating gate being laid between said source and drain above said semiconductor substrate;

a plurality of second floating gates being disposed between said source and drain, opposite to and intersecting said first floating gate, said plurality of second floating gates also being disposed distantly from each other; and for each of said second floating gates, a control gate disposed from one end of said drain of said second floating gate up to said drain.

5. A non-volatile memory according to claim 4, wherein said first floating gate extends in a direction intersecting a channel between the source and drain, and is disposed closer to said source.

6. A method of programming the non-volatile memory according to claim 4, said method comprising the steps of:

applying a high voltage to said drain and control gate; and injecting hot electrons induced thereby near one end of said drain of said second floating gate into said second floating gate by a field between said control gate and semiconductor substrate.

7. A method of programming the non-volatile memory according to claim 5, said method comprising the steps of:

applying a high voltage to said drain and control gate; and injecting hot electrons induced thereby near one end of said drain of said second floating gate into said second floating gate by a field between said control gate and semiconductor substrate.

8. A non-volatile memory according to claim 4 or 5, wherein said second floating gates have individually different areas facing said first floating gate.

9. A non-volatile memory according to claim 4 or 5, wherein said second floating gates have individually different distances from said first floating gate in a location opposite to said first floating gate.

10. A method of programming the non-volatile memory according to claim 6, said method comprising the steps of:

applying a high voltage to said drain and control gate; and injecting hot electrons induced thereby near one end of said drain of said second floating gate into said second floating gate by a field between said control gate and semiconductor substrate.

11. A method of programming the non-volatile memory according to claim 7, said method comprising the steps of:

applying a high voltage to said drain and control gate; and injecting hot electrons induced thereby near one end of said drain of said second floating gate into said second floating gate by a field between said control gate and semiconductor substrate.

* * * * *